(12) United States Patent
Harrington et al.

(10) Patent No.: US 6,525,326 B1
(45) Date of Patent: Feb. 25, 2003

(54) SYSTEM AND METHOD FOR REMOVING PARTICLES ENTRAINED IN AN ION BEAM

(75) Inventors: Eric R. Harrington, Ipswich, MA (US); Victor M. Benveniste, Gloucester, MA (US); Jeffrey A. Burgess, Manchester, MA (US); John Z. Ye, Brighton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 250 days.

(21) Appl. No.: 09/654,381

(22) Filed: Sep. 1, 2000

(51) Int. Cl.[7] ............................................... H01J 37/30
(52) U.S. Cl. ................... 250/492.21; 250/398
(58) Field of Search ........................... 250/398, 492.21, 250/492.2, 423 R

(56) References Cited

U.S. PATENT DOCUMENTS

| | | | |
|---|---|---|---|
| 4,683,922 A | | 8/1987 | Harrison et al. |
| 4,800,396 A | * | 1/1989 | Hertz ........................... 346/1.1 |
| 4,999,492 A | * | 3/1991 | Nakagawa ................... 250/281 |
| 5,049,739 A | * | 9/1991 | Okamoto ..................... 250/281 |
| 5,099,130 A | * | 3/1992 | Aitken ..................... 250/396 R |
| 5,134,299 A | | 7/1992 | Denholm |
| 5,399,871 A | | 3/1995 | Ito et al. |
| 5,656,092 A | | 8/1997 | Blake et al. |
| 5,670,217 A | | 9/1997 | Blake et al. |
| 5,693,939 A | * | 12/1997 | Purser ......................... 250/251 |
| 5,770,862 A | * | 6/1998 | Ooaeh et al. ................ 250/398 |
| 5,825,035 A | * | 10/1998 | Mizumura et al. ..... 250/492.21 |
| 6,125,522 A | * | 10/2000 | Nakasuji ....................... 29/458 |
| 6,326,631 B1 | * | 12/2000 | Politiek et al. ......... 250/492.21 |
| 6,236,054 B1 | * | 5/2001 | Barna et al. ............. 250/423 R |

FOREIGN PATENT DOCUMENTS

JP 408138621 A * 5/1996

* cited by examiner

Primary Examiner—Bruce Anderson
(74) Attorney, Agent, or Firm—Eschweiler & Associates, LLC

(57) ABSTRACT

A system for inhibiting the transport of contaminant particles with an ion beam includes an electric field generator for generating an electric field relative to a path of travel for the ion beam. A particle located in the ion beam and in a region of the electric field is charged to a polarity according to the ion beam, so that the electric field may urge the charged particle out of the ion beam.

27 Claims, 6 Drawing Sheets

SYSTEM AND METHOD FOR REMOVING PARTICLES ENTRAINED IN AN ION BEAM

TECHNICAL FIELD

The present invention generally relates to inhibiting particle transport in an ion beam and, more particularly to a system and method for providing an electrostatic system and method for inhibiting transport of microscopic particles within an ion beam.

BACKGROUND

In the manufacture of semiconductor devices, an ion implanter is employed to dope a semiconductor wafer or glass substrate with impurities. In particular, ion beam implanters are used to treat silicon wafers with an ion beam, in order to produce n or p type extrinsic materials doping or to form passivation layers during fabrication of an integrated circuit. When used for doping semiconductors, an ion beam implanter injects a selected ion species to produce a desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made extremely pure since ions of undesirable molecular weight are deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway, which effectively separates ions of different charge-to-mass ratios.

The ion beam is focused and directed at a desired surface region of the substrate. Typically, the energetic ions of the ion beam are accelerated to a predetermined energy level to penetrate into the bulk of a workpiece. The ions are embedded into the crystalline lattice of the material to form a region of desired conductivity, with the beam energy determining the depth of implantation. Examples of ion implantation systems include those available from Axcelis Technologies of Beverly, Mass.

Operation of an ion implanter or other ion beam equipment (e.g., linear accelerators) may result in the production of contaminant particles. The contaminant particles, for example, may be less than about 1 $\mu$m in size. The momentum of the ions in the beam that strike the particles, in turn, cause the particles to be transported with the beam, although typically at a speed much less than the ions. Consequently, particles entrained in an ion beam may be transported with the beam toward the wafer (or other substrate), resulting in undesired contamination at the wafer.

As semiconductor devices are manufactured at reduced sizes with greater precision, higher accuracy and efficiency are required of apparatuses for manufacturing such semiconductor devices. Accordingly, it is desirable to reduce the level of contaminant particles in an ion beam so as to mitigate wafer contamination.

SUMMARY

The present invention relates to a system and method for inhibiting the transport of a particle entrained in an ion beam. As a particle moves with an ion beam through an electric field, the particle becomes increasingly charged with a polarity matching the polarity of the ion beam. An electric field having an opposite polarity, which may be oriented at about 90° relative to the beam, urges the charged particle out of the ion beam, which particle may be urged into a particle containment system operatively associated with the electric field generator. The containment system is configured to inhibit reentry of a particle back into the ion beam after being urged from the beam. The containment system also may provide a mechanism to discharge the charged particle to a neutral potential and/or to reduce the kinetic energy of the particle so that it does not reenter the beam. As a result, particles may be removed or diverted from an ion beam in accordance with the present invention, thereby mitigating contamination of a workpiece.

Another aspect of the present invention provides a system for inhibiting transport of particles with an ion beam. The system includes first and second electrodes for generating an electric field therebetween generally transverse to a path of travel for the ion beam. A particle located in the ion beam within a region of the electric field is charged to a polarity according to the ion beam, so that the electric field may urge the charged particle out of the ion beam.

Yet another aspect of the present invention provides an ion implantation system. The system includes an ion source for emitting ions to treat a substrate located at an implantation station. An analyzing magnet system diverts ions of an appropriate mass to an implantation trajectory. The ion implantation system also includes a particle removal system for inhibiting transport of particles with the diverted ions from the analyzing magnet system. The particle removal system includes a pair of electrodes for generating an electric field therebetween generally transverse to a direction of travel for the diverted ions. A particle entrained in an ion beam formed of the diverted ions within a region of the electric field is charged by interactions with the diverted ions, so that the electric field may urge the charged particle out of the ion beam. A substrate is supported at the implantation station for treatment with ions from the particle removal system. As a result, particle contamination at the substrate is mitigated.

Another aspect of the present invention provides a system for inhibiting transport of particles with an ion beam. The system includes means for generating an electric field generally transverse to a path of the ion beam. A particle entrained in the ion beam and within the electric field is charged to a polarity matching the ion beam, so that the electric field may urge the charged particle out of the ion beam.

Still another aspect of the present invention provides a method for inhibiting transport of particles with an ion beam. The method includes generating an electric field generally transverse to a path of the ion beam and charging particles located in the ion beam and in a region of the electric field with a polarity matching the ion beam. At least some of the charged particles are then urged out of the ion beam.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DESCRIPTION OF THE INVENTION

The present invention provides a system and method for removing contaminant particles from an ion beam, such as may be utilized in conjunction with an ion implanter system. It will be appreciated, however, that the present invention has broader applications than for use with an ion implanter; the present invention may be employed to remove contaminant particles from an ion beam in applications other than those described herein. Moreover, while the examples illustrated and described with respect to FIGS. 1–6 mainly disclose removing particles from a positive ion beam, those skilled in the art will understand and appreciate that the present invention is equally applicable to removing particles from a negative ion beam.

Figure 1:
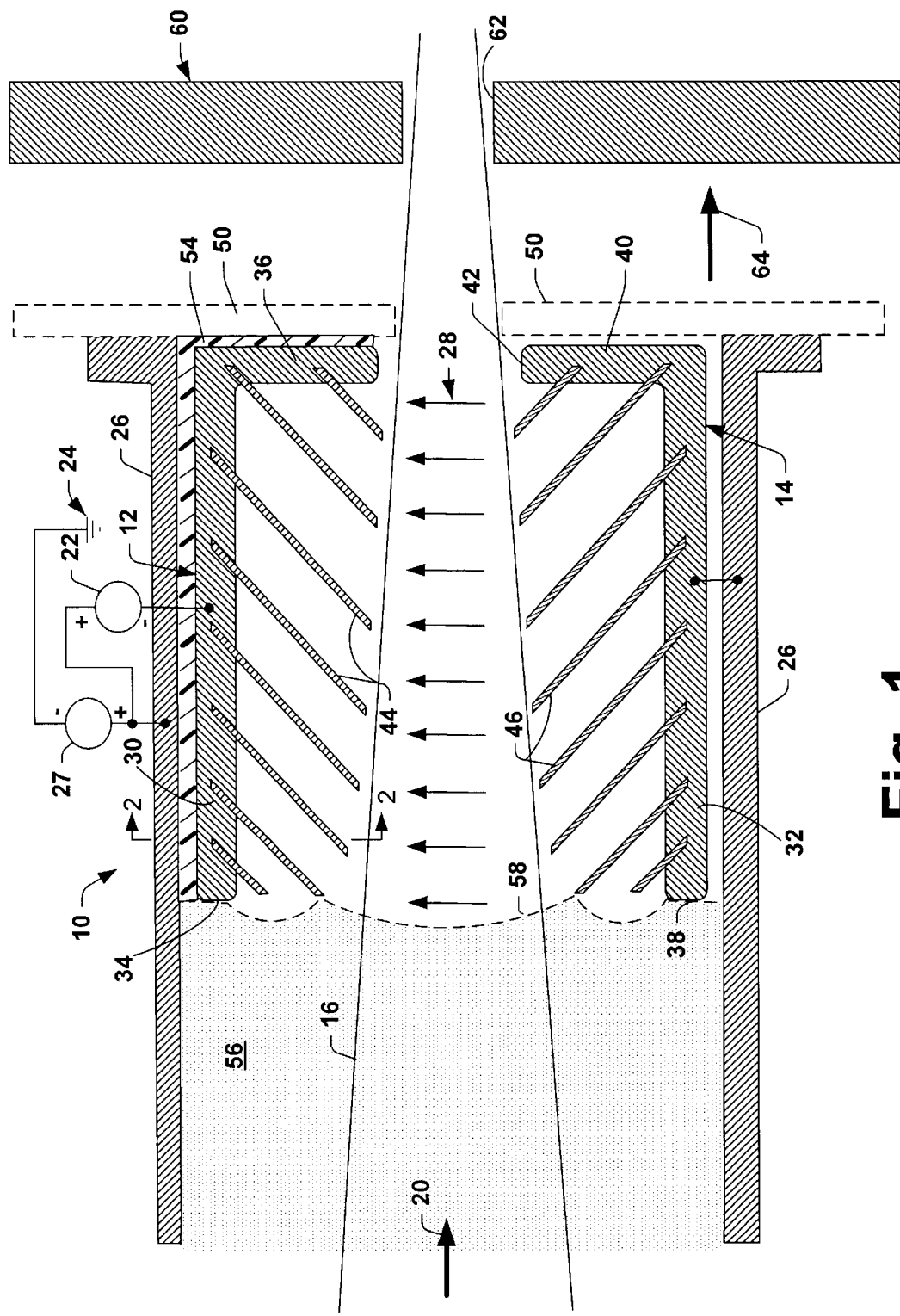
FIG. 1 is a side sectional view of a particle trap system in accordance with the present invention.

FIG. 1 illustrates a particle trap system 10 in accordance with an aspect of the present invention. The system 10 includes an electric field generator, which is illustrated as a pair of spatially separated electrodes 12 and 14 located on substantially opposed sides of an ion beam 16. The ion beam 16 travels in a beam direction, indicated at 20. In particular, the electrode 12 is a negative electrode electrically coupled to a suitable DC power source 22. By way of example, the power source 22 may be energized to about −1 kV so as to energize the electrode 12 to a negative potential relative to that of another electrode 26. The electrode 26 is connected to another power source 27 that is positive(e.g., about +40 kV) relative to electrical ground. As a result there is no electric field between that of 14 and 26. An electric field exits between the electrodes 12 and 26 and electrodes 12 and 14, which in this example is equal to about −1 kV. As a result, an electric field, indicated schematically at 28, is established between the pair of opposed electrodes from the electrode 14 to the electrode 12, which is generally transverse relative to the beam direction 20. As mentioned above, the electrode 14 is positive relative to the electrode 12 but has the same potential as that of the electrode 26.

By way of example, each of the electrodes 12, 14 has a semi-cylindrical sidewall portion 30, 32 extending substantially parallel to the beam direction 20. The sidewall portion 30 extends an axial length (e.g., about 100 mm or less) between upstream and downstream ends 34 and 36, respectively. The other sidewall portion 32 also extends between respective upstream and downstream ends 38 and 40 coextensively with the opposed sidewall portion 30. An aperture 42 thus is formed between the downstream ends 36 and 40 of the respective electrodes 12 and 14, through which the ion beam 16 may pass. A plurality of elongated trap members 44 and 46 extend generally radially inwardly from the respective sidewall portions 30 and 32 so as to surround the ion beam 16. The trap members 44 and 46 may be elongated sheets of an electrically conductive material, such as graphite or other suitable material. The trap members also may be slanted in an upstream direction (as illustrated) to facilitate trapping particles as they move downstream.

It will be understood and appreciated by those skilled in the art that other trap mechanisms may, in accordance with the present invention, be operatively associated with the electrodes to inhibit reentry of particles into the ion beam 16. While, for purpose of simplification of illustration, FIG. 1 illustrates eight trap members 44 and 46 on each respective electrode 12, 14, it also is to be appreciated that a greater or lesser number of trap members may be utilized in accordance with the present invention. It is also to be appreciated that other configurations of electric field generators also may be utilized to generate an electric field for use in accordance with the present invention.

Figure 2:
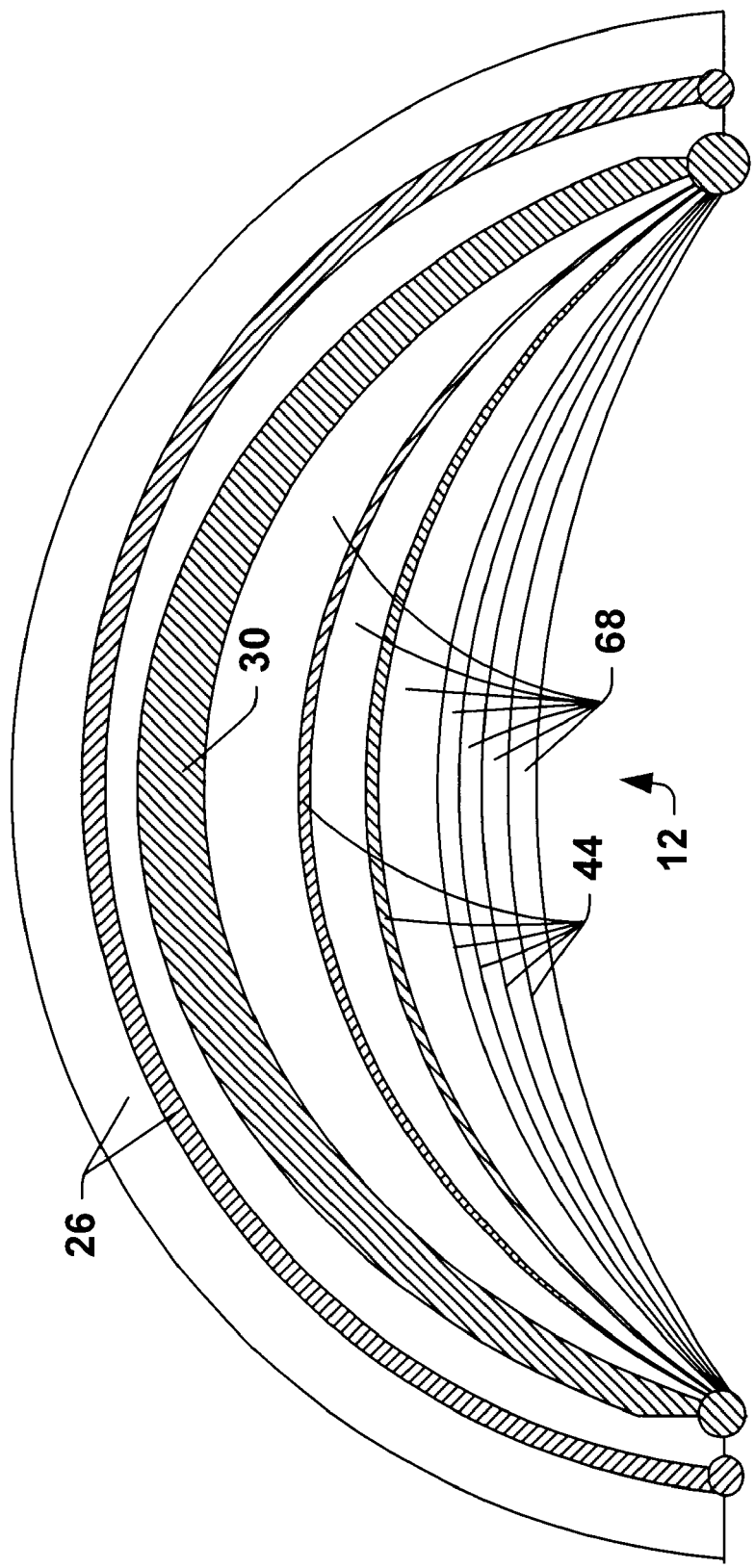
FIG. 2 is partial cross sectional view of an electrode of FIG. 1, taken along line 2—2.

FIG. 2 illustrates an exemplary cross-sectional view of the electrode 12 taken along line 2—2 of FIG. 1. As mentioned above, the cylindrical sidewall 30 has a curved cross section from which each of the trap members extends. Each the trap members 44 also has a curved radially inner extent, with each trap member in a downstream direction extending radially inward by a greater amount. Those skilled in the art will understand and appreciate that the opposed electrode 14 may be dimensioned and configured substantially identically to the electrode 12.

With reference back to FIG. 1, the downstream ends 36 and 40 of the respective electrodes 12 and 14 may be connected to an electrically conductive annular support assembly 50. The terminal electrode 26 also is attached to the annular support 50. A spacer 54 formed of an electrically insulating material is interposed between the negative electrode 12 and the terminal electrode 26 and the support 50 to electrically isolate the electrode 12 from the terminal electrode 26. The terminal electrode 26 circumscribes the pair of electrodes 12 and 14, as illustrated.

A sheath of plasma 56, consisting of ions and electrons, exists outside of a region establishing the electric field between the electrodes 12 and 14. The plasma sheath 56 tends to neutralize space charge caused by the ion beam 16, thereby largely eliminating transverse electric fields that might otherwise disperse the beam. The plasma sheath 56 also enhances beam containment. The ion beam 16 and the plasma sheath 56 move in the direction 20 and interact with the field 28. The electric field 28 extinguishes (or blows off) the plasma sheath 56 thereby forming a boundary 58 between the plasma sheath and the field between the electrodes 12 and 14 (e.g., a transition is created from a plasma region to a region without plasma). The absence of the plasma 56 between the electrodes 12 and 14 creates an environment more conducive to diverting a particle relative to the ion beam 16 in accordance with an aspect of the present invention.

A variable resolving electrode 60 may be located downstream and electrically isolated relative to the particle removal system 10. The variable resolving electrode 60 is operable to accelerate the ions in the ion beam 16 to a desired energy level. The variable resolving electrode 60 includes an aperture (e.g., a variable resolving aperture) 62 through which the ion beam 16 passes. The support assembly 50, which is electrically coupled to the terminal electrode 26, and the variable resolving electrode 60 form an acceleration system. The variable resolving electrode 60, for example, is at a sufficiently low voltage potential relative to the support assembly 50 so as to accelerate ions in the ion beam 16 intermediate the support assembly 50 and the electrode 60. For example, the variable resolving electrode 60 may be at about –7 kV relative to the electrode 24. The voltage source 27 causes the electrode 26 and the support assembly 50 to be positive (e.g., about 40 kV), which, in turn, generates an acceleration field 64.

Figure 3:
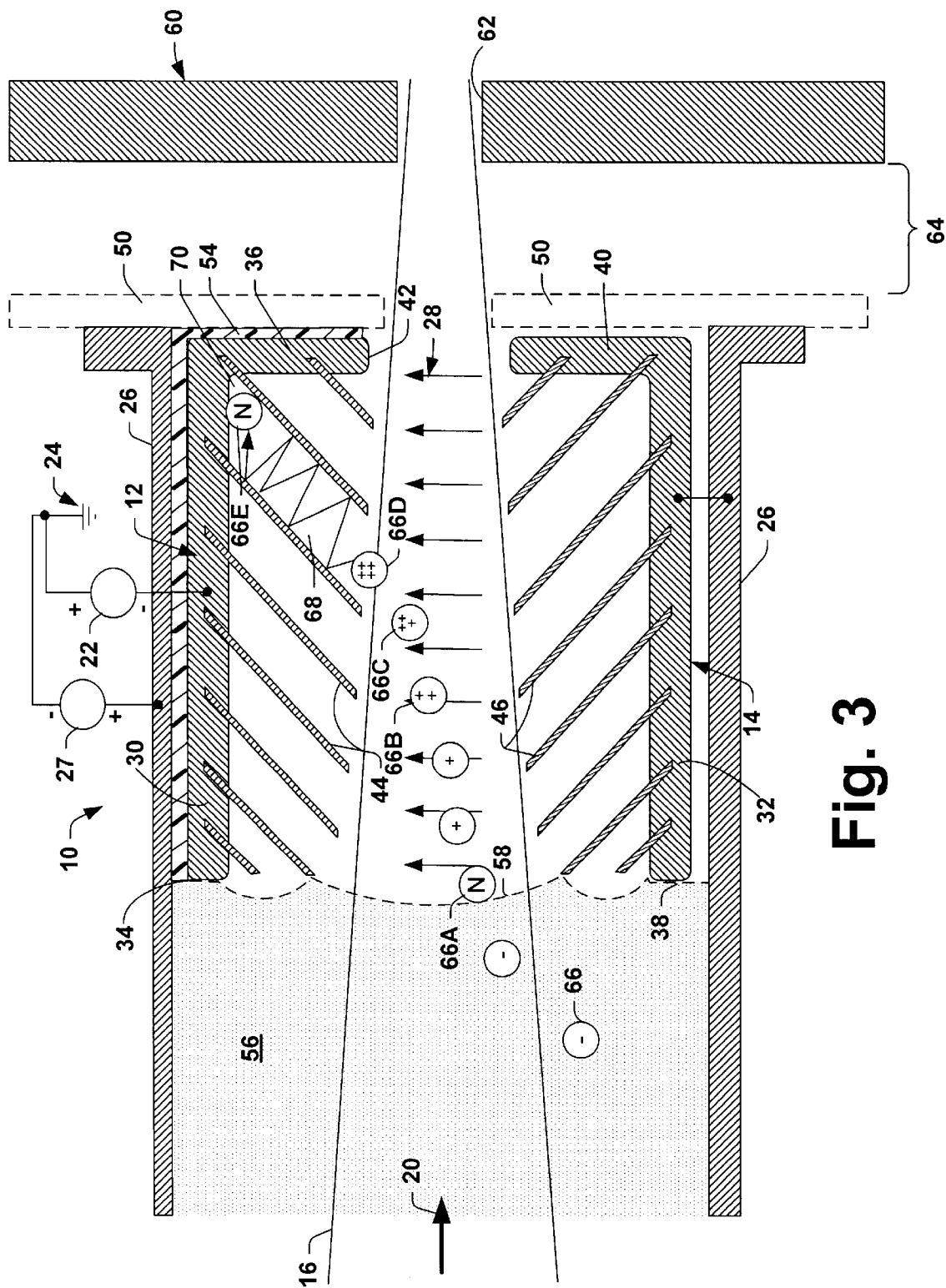
FIG. 3 is another view of the system of FIG. 1, illustrating an example of a particle trajectory in accordance with the present invention.

FIG. 3 illustrates an example of a trajectory for a particle 66 in the system 10 of FIG. 1, in which identical reference numbers refer to parts previously identified with respect to FIG. 1. Particles typically travel in the ion beam 16 at speeds that are significantly slower than the ions of the beam. Consequently, movement of particles with the beam 16 is due, at least in part, to the transfer of momentum from the ions of the beam to the particle.

By way of example, a particle 66 begins its trajectory at a location within the plasma sheath 56 outside of the ion beam 16. In the plasma sheath 56, numerous free electrons move with a higher velocity than the ions in the beam 16 so that the particle 66 tends to have a higher collision rate with electrons than with ions. Consequently, the particle 66 tends to assume a negative charge while in the plasma sheath 56. As the particle 66 enters the ion beam 16, the momentum of the ions urges the particle in the beam direction 20 and through the boundary 58.

After the particle 66 enters the region between the electrodes 12 and 14 (which is substantially plasma free), the ions of the beam 16 collide with the particle with sufficient frequency and velocity so that the particle begins to take on a charge that matches the polarity of the ion beam. For example, the charge of the particle 66 changes polarity from negative (when in the plasma sheath 56) to electrically neutral (particle 66A), as illustrated in FIG. 3.

Ion beams may be characterized as a weak plasma consisting of fast ions, plus slow ions and electrons generated by collisions with residual gas and objects near the beam path. The "plasma" tends to reduce the repulsive forces the ions in the beam which tend to all charge to the same sign. Microscopic contaminant particles moving in a beam plasma may become negatively charged, because the electron flux can be higher than the positive ion flux striking such particles. When such a beam enters an electric field having a potential greater than the electron energy, electrons tend not to follow the ion beam. In such a region, microscopic particles become positively charged due to collisions of fast ions. A negative electrode that generates this electric field helps ensure that the entrained particles become positively charged. As a result of repeated collisions with the ions, the particle 66, in turn, becomes positively charged. Because the mass of the particle 66 is much greater than the ions in the beam 16, the particle is able to accumulate a much greater positive charge in response to being bombarded with the rapidly moving positive ions. As a result, the ions of the beam 16 continue to collide with and positively charge the particle 66B and propel it in a downstream direction 20. Thus, the particle becomes increasingly positively charged, as indicated at 66C and 66D.

After the particle accumulates a sufficient amount of positive charge (e.g., particle 66D), the electric field 28 urges the particle in the direction of the field toward one of the electrodes 12. A system that includes the electrode 26, the support assembly 50, and the electrodes 12 may be oriented so that the electric field 28 is substantially aligned with gravity. In this way, gravitational forces and the forces from electric field 28 operating on the charged particle 66 may cooperate to urge the particle out of the ion beam 16.

As illustrated in the example in FIG. 3, the particle 66D is urged away from the direction of beam travel 20 and out of the beam 16. In particular, the particle is urged into an interstitial space 68 located between an adjacent pair of trap members 44. The particle 66D may ricochet in the interstitial space 68 between trap members to reduce the kinetic energy of the particle; the kinetic energy is transferred to the trap members 44 by contact. The contact with the trap members 44 of the electrode 12 also causes the particle 66E to discharge to a neutral charge. The particle 66E, in turn, settles in a substantially field free region 70 that does not have a direct line of sight with the beam 16 (e.g., at a juncture of the sidewall 32 and trap members 44).

It is to be appreciated that even if a particle happens to contact a radially inner end of one of the trap members 44, 46, there is a significant likelihood that the particle will subsequently be urged between another pair of the trap members prior to exiting the downstream aperture 42. The further a particle travels downstream between the electrodes 12 and 14, the greater the force exerted on the particle by the electric field 28. That is, the field strength increases as a function of distance through the system 10. The increase in field strength may be attributed to a reduced distance between the electrodes 12 and 14 near the aperture as well as to the increased distance from the plasma sheath 56 (e.g., there may be no free electrons near the aperture 42.

The likelihood of a particle 66 entering an interstitial space 68 also may be enhanced by forming the system 10 with a greater axial length along the direction of the beam travel 20 (e.g., with longer sidewall portions 30 and 32). The greater length may result in a particle accumulating a greater charge in the electric field region as well as providing more opportunities to enter an interstitial space.

Figure 4:
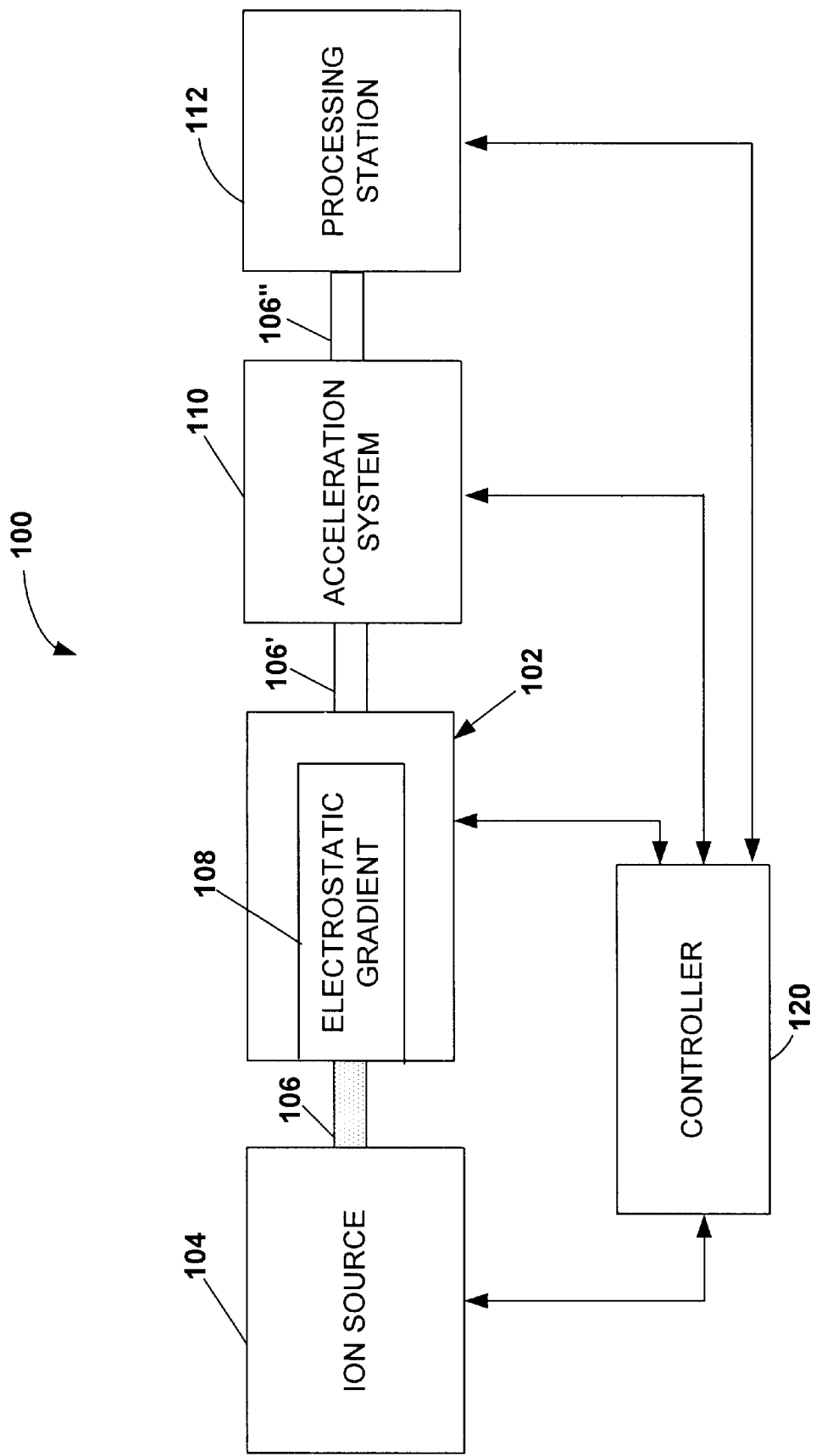
FIG. 4 is a schematic block representation of an ion implantation system employing a particle removal system in accordance with the present invention.

In order to provide context for the present invention, FIG. 4 is a functional block representation of an ion beam processing system 100 employing a particle removal system 102 in accordance with an aspect of the present invention. By way of example, the system 100 may be an ion implantation system, a particle accelerator or a system employing an ion beam of any type and/or any charged particles (positive or negative) in which it may be desirable to remove and/or divert contaminant particles.

The system 100 includes an ion source 104 that emits ions that form an ion beam 106. The ion source 104, for example, includes a chamber into which source materials, such as an ionizable gas or vaporized materials, are injected. Energy is applied to the source materials to generate ions that, in turn, exit the chamber to form the ion beam 106 (positive or negative). Ion sources are well known to those skilled in the art and details concerning such sources are, therefore, omitted for sake of brevity. An example of an ion source that employs microwave energy to ionize source materials is disclosed in U.S. Pat. No. 5,523,652, which is incorporated herein by reference. Those skilled in the art will understand and appreciate that other ion sources, which may or may not undergo additional processing, may be utilized as an ion source for use in conjunction with a particle removal system 102 in accordance with an aspect of the present invention.

In accordance with an aspect of the present invention, the ion source 104 provides the beam 106 to the particle removal system 102. The particle removal system 102 employs an electric field 108 to facilitate removal of contaminant particles entrained in the ion beam 106. By way of example, the system 102 may include an electrode assembly having a pair of spatially separated electrodes substantially located on opposite sides of the ion beam. The electrodes are energized to generate the electric field 108. In accordance with one aspect of the present invention, the electric field 108 is substantially perpendicular to the beam direction. Additionally, the electric field 108 may be aligned so as to urge a particle in the substantially same direction as gravity. In this way, forces from the electric field and gravitation forces may cooperate to move contaminant particles out of the beam 106.

By way of example, the electric field 108 extinguishes (or blows off) a plasma sheath adjacent the particle trap system 102 through which the ion beam 106 passes. This establishes a barrier between the plasma sheath and the region within the trap system 102. The absence of the plasma creates an environment within the trap system 102 that facilitates the particle removal function in accordance with an aspect of the present invention. The numerous ions of the ion beam 106, which move downstream much more quickly than the particles, positively charge the particles entrained in the beam 106. The electric field 108 deflects positively charged particles from the beam. The more positive a particle becomes, the greater the particle deflection from the beam. As a result, the continued transport of contaminant particles with the ion beam 106' is inhibited as the beam exits the trap system 102. Advantageously, the field is selected so that divergence of the ion beam is small relative to particle divergence.

The particle removal system 102 further may include a containment system substantially surrounding the beam for physically inhibiting downstream progress of a particle after being urged from the beam. One example of a system or method for capturing contaminant particles after being urged from an ion beam are the trap members 44 and 46 shown and described with respect to FIGS. 1 and 2. Another example of system or method for capturing contaminant particles after being urged from an ion beam is disclosed in U.S. Pat. No. 5,656,092, which is entitled APPARATUS FOR CAPTURING AND REMOVING CONTAMINANT PARTICLES FROM AN INTERIOR REGION OF AN ION IMPLANTER and incorporated herein by reference.

Referring back to FIG. 4, particle removal system 102 may provide a beam 106' to an ion beam accelerator system 110 or other analysis or processing systems (e.g., mass analysis, focusing). The ion beam acceleration system 110, for example, is formed of a group of electrodes that establish a voltage gradient along the beam axis for selectively accelerating and/or decelerating the beam to a desired energy level. Acceleration/deceleration electrodes further may be employed to focus the ion beam 106' to provide a focused, accelerated beam 106" having a substantially uniform intensity over a target area.

The accelerated beam 106" is then provided to a processing station 112. By way of example, the processing station 112 may be an implantation station (for ion implantation), an analysis station (for substrate analysis), or other systems that may employ an ion beam.

A controller 120 may be operatively associated with each of the ion source 104, the particle removal system 102, acceleration system 110, and the processing station 112. The controller 120 may monitor and control the ion beam characteristics provided to the processing station 110. The controller 120 may be formed of hardware and/or software programmed and/or configured to implement desired control functionality with respect to the various parts of the system 100 to control parameters of the ion beam 106.

Figure 5:
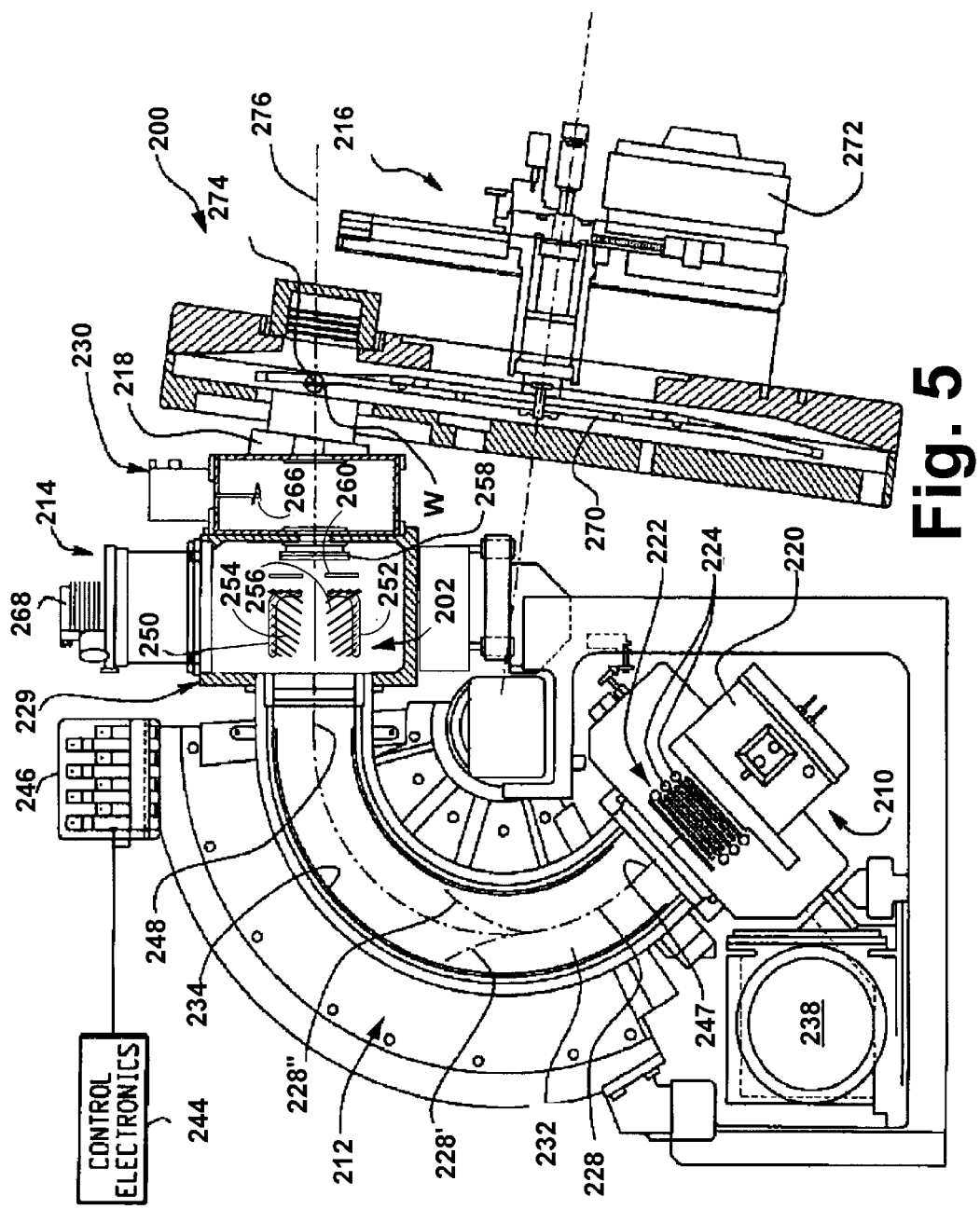
FIG. 5 is a partial sectional view of an example of an ion implantation system employing a particle removal system in accordance with the present invention.

In order to provide additional context for the present invention, FIG. 5 illustrates an example of an ion implantation system 200 configured to employ a particle removal system 202 in accordance with an aspect of the present invention. The ion implantation system 200 includes an ion source 210, a mass analysis magnet 212, a beamline assembly 214, and a target or end station 216. An expansible stainless steel bellows assembly 218, which permits movement of the end station 216 with respect to the beamline assembly 214, connects the end station 216 and the beamline assembly 214. Although FIG. 5 illustrates an example of an ultra low energy (ULE) ion implantation system, a particle trap, in accordance with the present invention, has applications in other types of implanters as well.

The ion source 210 comprises a plasma chamber 220 and an ion extractor assembly 222. Energy is imparted to an ionizable dopant gas to generate ions within the plasma chamber 220. Generally, positive ions are generated, although the present invention is applicable to systems wherein negative ions are generated by the source 210. The positive ions are extracted through a slit in the plasma chamber 220 by the ion extractor assembly 222, which comprises a plurality of electrodes 224. The electrodes 224 are charged with negative potential voltages, increasing in magnitude as the distance from the plasma chamber slit increases. Accordingly, the ion extractor assembly 222 functions to extract a beam 228 of positive ions from the plasma chamber 220 and to accelerate the extracted ions into the mass analysis magnet 212.

The mass analysis magnet 212 functions to pass ions having an appropriate charge-to-mass ratio to the beamline assembly 214, which comprises a resolving housing 229 and a beam neutralizer 230. The mass analysis magnet 212 includes a curved beam path 232 defined by an aluminum beam guide 234 having arcuate cylindrical side walls, evacuation of which is provided by a vacuum pump 238. The ion beam 228 that propagates along this path 232 is affected by the magnetic field generated by the mass analysis magnet 212 to reject ions of an inappropriate charge-to-mass ratio. The strength and orientation of this dipole magnetic field is controlled by control electronics 244, which adjust the electrical current through the field windings of the magnet 212 through a magnet connector 246.

The dipole magnetic field causes the ion beam 228 to move along the curved beam path 232 from a first or entrance trajectory 247 near the ion source 210 to a second or exit trajectory 248 near the resolving housing 229. Portions 228' and 228" of the beam 228 (comprised of ions having an inappropriate charge-to-mass ratio) are deflected away from the curved trajectory and into the walls of an aluminum beam guide 234. In this manner, the magnet 212 passes to the resolving housing 229 only those ions in the beam 228 that have the desired charge-to-mass ratio.

By way of example the particle removal system 202 is positioned in the resolving housing 229, although it is to be appreciated that the system may, in accordance with the present invention, be located in other parts of the ion implantation system 200. It may be desirable to position the trap system prior to acceleration of the ion beam (if utilized) so that increased field strengths are not required to provide an adequate potential barrier to impede transport of accelerated contaminant particles in the beam.

The trap system 202 includes an arrangement of spatially separated electrodes 250 and 252 arranged on substantially opposed sides of the beam 228 between the mass analysis magnet 212 and a dosimetry indicator, such as a Faraday flag 258. By way of example, the electrode 250 is a negative electrode electrically connected to a suitable DC source to provide a negative electric field relative to ground potential. The other electrode 252 is electrically coupled to a potential (e.g., electrical ground or a positive potential relative to the electrode 250) so that an electric field is established between the electrodes 250 and 252. The electrodes 250 and 252 may be oriented relative to each other so that the electric field is aligned with gravity, so that gravitational forces and the electric field may cooperate to urge charged particles from the ion beam 228. A plurality of elongated trap members 254 and 256 may extend generally radially inwardly and slanted in an upstream direction relative to the ion beam. The trap members 254 and 256 inhibit the reintroduction of particles back into the ion beam 228 after being urged from the beam by the electric field.

A plasma sheath may exist in a region between the mass analysis magnet 212 and the system 202 through which the beam 228 passes. The electric field between the electrodes 250 and 252 extinguishes the plasma sheath, which creates an environment more conducive to diverting contaminant particles in accordance with an aspect of the present invention. In particular, in the absence of the plasma sheath, particles entrained in the beam 228 are positively charged due to collisions with the positively charged ions in the beam.

Prior to reaching the downstream end of the electrodes 250 and 252, the particles are sufficiently positively charged so that the electric field operates to urge the particles in the direction of the field (see, e.g., FIG. 3). The particles may be urged out of the beam 228 toward the ground electrode 252. In accordance with an aspect of the present invention, a deflected particle is urged away from the beam and into an interstitial space located between a pair of the trap members 254 or 256 of a given electrode. A particle thus may ricochet in the interstitial space until the amount of kinetic energy of a particle reduces such that the particle settles in a region that does not have a direct line of sight with the beam 228. It is to be appreciated that other particle containment systems, different from the trap members 254 and 256, may be employed to inhibit reentry of a particle into the ion beam 228 in accordance with an aspect of the present invention. Additional acceleration may (optionally) be implemented by providing a variable resolving aperture electrode 260 that is at low voltage potential relative to an exit aperture of the particle removal system 202 so as to provide a desired electric field gradient in the direction of the ion beam 228 for accelerating ions in the beam.

The beam neutralizer 230 may include a plasma shower 266 for neutralizing the positive charge that may accumulate on the target wafer as a result of being implanted by the positively charged ion beam 240. The beam neutralizer 230 and resolver housing 229 are evacuated by a vacuum pump 268.

Downstream of the beam neutralizer 230 is the end station 216, which includes a disk-shaped wafer support 270 upon which wafers to be treated are mounted. The wafer support 270 resides in a target plane, which is generally perpendicularly oriented relative to the direction of the implant beam. A motor 272 rotates the disc shaped wafer support 270 at the end station 216. The ion beam thus strikes wafers mounted to the support as they move in a circular path. The end station 216 pivots about point 274, which is the intersection of the path 276 of the ion beam and the wafer W, so that the target plane is adjustable about this point.

Figure 6:
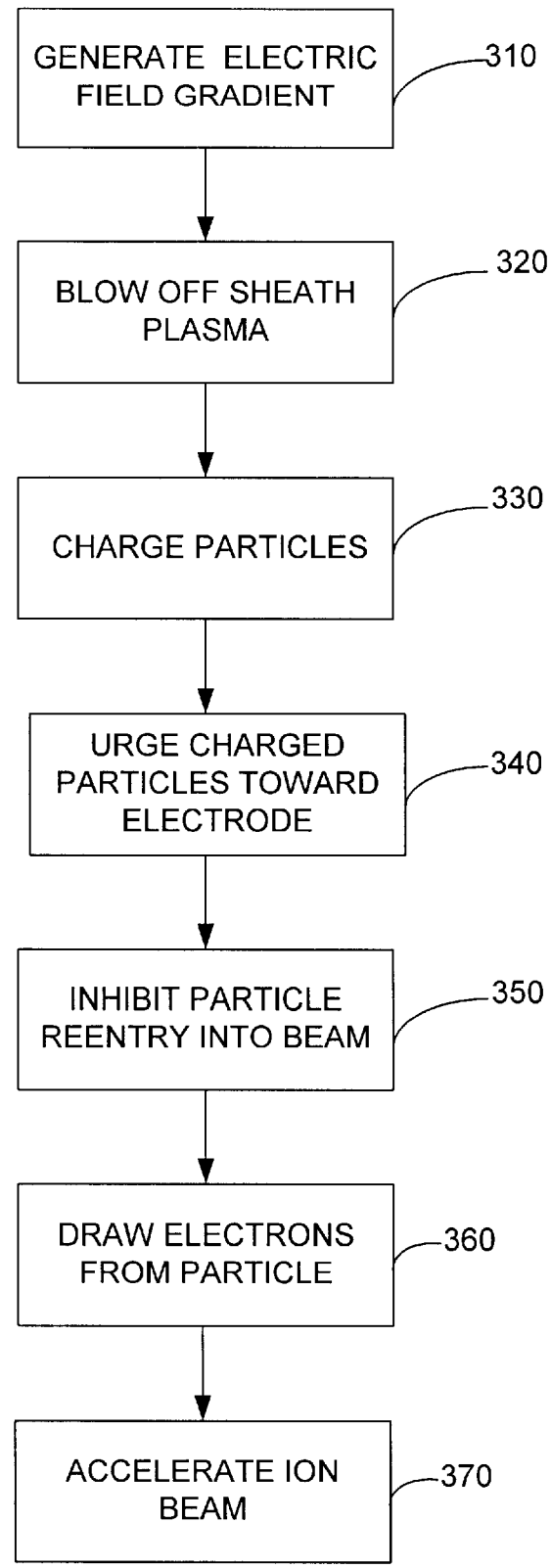
FIG. 6 is a flow diagram illustrating a methodology for inhibiting the transport of particles with an ion beam.

FIG. 6 is a flow diagram illustrating an example of a methodology for inhibiting particle transport in an ion beam in accordance with an aspect of the present invention. While, for purposes of simplicity of explanation, the methodology of FIG. 6 is shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the present invention.

Referring to FIG. 6, the illustrated methodology begins at step 310, in which an electric field is generated in a direction generally transverse to the path of an ion beam. The electric field may be substantially aligned with gravity, so that gravitational forces and the electric field may cooperate to urge charged particles out of the ion beam. The electric field also operates to extinguish a sheath of plasma (step 320) through which the ion beam is passing. The plasma sheath provides a negatively charged environment that, in turn, tends to cause particles to also take on a negative charge. The particles and ions continue to move downstream in the beam direction in the absence of the plasma sheath.

At step 330, the particles begin to take on a positive charge due to the interactions with the ions in the ion beam. Next, at step 340, the charged particles are urged in the direction of the electric field and out of the ion beam. In accordance with an aspect of the present invention, the particles may be urged toward a particle containment system. The movement of particles may be facilitated by gravitational forces as described herein. The process proceeds to step 350, in which the particles are inhibited from reentering the ion beam, such as due to interactions with a containment system that may be operatively associated with one or both electrodes. The interactions with the electrode and/or the containment system also operate to draw electrons from the particle (step 360), thereby causing the particle to take on a more positive charge. As a result, particle contamination of a downstream substrate is mitigated.

After the particles have been removed from the ion beam (either out of the ion beam or on a modified trajectory), the process may proceed to step 370. At step 370, the ion beam may be accelerated to a desired energy level, such as by providing a suitable electric field gradient commensurate with the desired level of acceleration. It is to be appreciated that acceleration may occur prior to trapping the particles or acceleration may not be employed altogether, in accordance with an aspect of the present invention.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In this regard, it will also be recognized that the invention includes a computer-readable medium having computer-executable instructions for performing the steps of the various methods of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising."

What is claimed is:

1. A system for inhibiting transport of particles with an ion beam comprising:
    first and second electrodes for generating an electric field therebetween generally transverse to a path of travel for the ion beam;
    wherein a particle located in the ion beam and in a region of the electric field is charged to a polarity matching the ion beam, the electric field urging the charged particle away from the path of the ion beam;
    a particle containment system operatively associated with at least one of the first and second electrodes for inhibiting reentry of the charged particle into the ion beam; and
    wherein the particle containment system includes a plurality of trap members operatively associated with each of the first and second electrodes.

2. The system of claim 1, wherein the electric field is substantially aligned with gravity, whereby gravitational forces and the electric field cooperate to urge the charged particle out of the ion beam.

3. The system of claim 1, wherein the electric field inhibits downstream travel of plasma into the electric field, thereby providing an environment to facilitate charging of the particle within the ion beam.

4. The system of claim 1, wherein each of the first and second electrodes further comprises a substantially semi-cylindrical sidewall portion extending substantially parallel to the path of travel, the sidewall portions being spatially separated from each other so that the ion beam passes therebetween.

5. The system of claim 4, wherein the plurality of trap members are operatively associated with and extend in a generally upstream and radially inward direction from an inner surface of each of the sidewall portions so as to substantially surround the ion beam.

6. The system of claim 1 further including an acceleration electrode located downstream relative to the first and second electrodes for accelerating the ion beam a desired amount.

7. The system of claim 1, wherein the plurality of trap members are elongated sheets of electrically conductive material.

8. The system of claim 1, wherein the plurality of trap members are slanted in an upstream direction to facilitate trapping of the charged particle.

9. The system of claim 1, wherein the plurality of trap members have a curved radially inner extent, with respective members in a downstream direction extending radially inward by a greater amount.

10. An ion implantation system comprising:
    an ion source for emitting ions to treat a substrate located at an implantation station;
    an analyzing magnet system for diverting ions of an appropriate mass to an implantation trajectory;
    a particle removal system for inhibiting transport of particles with the diverted ions from the analyzing magnet system, the particle removal system comprising:
        an electric field generator for generating an electric field, the electric field being operable to urge a particle located in an ion beam formed of the diverted ions away from a direction of travel for the ion beam; and
    wherein the electric field generator further includes first and second of electrodes for generating the electric field between the first and second electrodes generally transverse to the direction of travel for the ion beam;
    a substrate supported at the implantation station for treatment with ions from the particle removal system, whereby particle contamination at the substrate is mitigated;
    a particle containment system operatively associated with at least one of the first and second electrodes for inhibiting reentry of the charged particle into the ion beam; and
    wherein the particle containment system includes a plurality of trap members operatively associated with each of the first and second electrodes.

11. The system of claim 10, wherein the electric field is substantially aligned with gravity, so that gravitational forces and the electric field cooperate to urge the charged particle away from the direction of travel for the ion beam.

12. The system of claim 10, wherein the electric field inhibits downstream travel of plasma into the electric field, thereby providing an environment to facilitate charging of particles located in the ion beam and the electric field, the electric field urging charged particles away from the direction of travel for the ion beam.

13. The system of claim 10, further including an acceleration electrode located intermediate the particle removal system and the implantation station for accelerating the ion beam to a desired energy level.

14. The system of claim 10, wherein the plurality of trap members are associated with and extend in a generally upstream and radially inward direction from an inner surface of each of the sidewall portions so as to substantially surround the ion beam.

15. The system of claim 10, wherein the first electrode and the second electrode further comprise a substantially semi-cylindrical sidewall portion extending substantially parallel to a path of travel, the sidewall portions being spatially separated from each other so that the ion beam passes there between.

16. The system of claim 15, wherein the plurality of trap members are operatively associated with and extend in a generally upstream and radially inward direction from an inner surface of each of the sidewall portions so as to substantially surround the ion beam.

17. The system of claim 10, wherein the plurality of trap members define a plurality of interstitial spaces between the trap members that is operative to reduce kinetic energy of the particle and to discharge the particle.

18. A method for inhibiting transport of particles with an ion beam, the method comprising the steps of:
generating an electric field;
charging particles located in the ion beam and in a region of the electric field with a polarity matching the ion beam;
urging at least one of the charged particles away from a direction of travel for the ion beam; and
further inhibiting reentry of the charged particle into the ion beam.

19. The method of claim 18, wherein the step of generating further includes generating the electric field substantially aligned with gravity, such that gravitational forces and the electric field cooperate to urge the charged particle out of the ion beam.

20. The method of claim 18 further including the step of inhibiting downstream travel of plasma with the ion beam into the electric field, thereby providing an environment to facilitate the step of charging.

21. The method of claim 18 further including the step of accelerating the ion beam after the step of urging.

22. The method of claim 18, wherein inhibiting reentry comprises ricocheting the charged particle against a plurality of trap members, transferring kinetic energy from the charged particle to the plurality of trap members by contact and discharging the charged particle to a neutral charge.

23. An ion implantation system, comprising:
an ion source operable to emit ions to treat a substrate located at an implantation station;
a mass analyzer system operable to divert ions of an appropriate mass from the ion source to an implantation trajectory;
a contaminant particle removal system downstream of the mass analyzer and operable to inhibit transport of contaminant particles with the diverted ions to the implantation station, the contaminant particle removal system comprising:
an electrical field generator having an upstream end and a downstream end, respectively, and operable to generate an electric field having a magnitude at the upstream end that is less than a magnitude at the downstream end; and
wherein the electric field is operable to substantially extinguish a plasma sheath associated with the implantation station having the substrate supported thereon, the implantation station located downstream of the contaminant particle removal system and operable to receive treatment from diverted ions exiting the downstream end of the electric field generator of the contaminant particle removal system, such that particle contamination at :the substrate is mitigated.

24. The system of claim 23, wherein the contaminant particle removal system further comprises a plurality of trap members that mitigate reentry of the contaminant particles.

25. The system of claim 24, wherein the plurality of trap members are electrically conductive and are connected to a pair of electrodes of the electric field generator, the pair of electrodes being operative to generate the electric field.

26. The system of claim 25, wherein the plurality of trap members extend radially from the pair of electrodes, wherein respective members toward the upstream end having a greater length.

27. The system of claim 24, wherein the plurality of trap members are operative to discharge the contaminant particles to a neutral charge.

* * * * *